(12) United States Patent
Song et al.

(10) Patent No.: US 7,949,081 B2
(45) Date of Patent: May 24, 2011

(54) PHASE DETECTING CIRCUIT AND CLOCK GENERATING APPARATUS INCLUDING THE SAME

(75) Inventors: Hee Woong Song, Ichon (KR); Kun Woo Park, Ichon (KR); Yong Ju Kim, Ichon (KR); Jong Woon Kim, Ichon (KR); Ic Su Oh, Ichon (KR); Hyung Soo Kim, Ichon (KR); Tae Jin Hwang, Ichon (KR)

(73) Assignee: Hynix Semiconductor Inc. (KR)

( * ) Notice: Subject to any disclaimer, the term of this patent is extended or adjusted under 35 U.S.C. 154(b) by 658 days.

(21) Appl. No.: 12/026,384

(22) Filed: Feb. 5, 2008

(65) Prior Publication Data

US 2009/0097608 A1    Apr. 16, 2009

(30) Foreign Application Priority Data

Oct. 10, 2007    (KR) .................. 10-2007-0102098

(51) Int. Cl.
*H04L 7/04* (2006.01)
*H03L 7/00* (2006.01)

(52) U.S. Cl. ........................... 375/375; 331/25

(58) Field of Classification Search .............. 375/327, 375/373–376; 327/6, 147, 148, 156, 157; 331/25

See application file for complete search history.

(56) References Cited

U.S. PATENT DOCUMENTS

| | | | |
|---|---|---|---|
| 5,889,437 A | 3/1999 | Lee | |
| 5,995,512 A * | 11/1999 | Pogue, Jr. | ..................... 370/419 |
| 6,566,920 B1 | 5/2003 | Kim | |
| 6,646,477 B1 | 11/2003 | Xin-LeBlanc | |
| 6,690,209 B1 * | 2/2004 | Cyrusian | ......................... 327/12 |
| 7,084,670 B1 | 8/2006 | Chiu | |
| 7,102,448 B2 | 9/2006 | Chou et al. | |
| 7,161,391 B2 * | 1/2007 | Lin | .................................. 327/3 |
| 2005/0028019 A1 * | 2/2005 | Kim | .............................. 713/500 |

FOREIGN PATENT DOCUMENTS

| | | |
|---|---|---|
| JP | 2007-189404 | 7/2007 |
| KR | 1020030088570 A | 11/2003 |
| KR | 1020040037798 A | 5/2004 |
| KR | 1020060010034 A | 2/2006 |
| KR | 1020060088415 A | 8/2006 |

* cited by examiner

*Primary Examiner* — Young T. Tse
(74) *Attorney, Agent, or Firm* — Baker & McKenzie LLP

(57) ABSTRACT

A phase detecting circuit includes a first node that outputs a pull-up control signal, a second node that outputs a pull-down control signal, an initializing unit that initializes voltage levels of the first and second nodes in response to a pre-charge signal, a data input unit to which receives a receiver data, a phase comparison unit that compares a phase of a receiver clock and a phase of the receiver data input to the data input unit to control the voltage levels of the first and second nodes, and a charging/discharging unit that charges or discharges electric charges that are applied to the first and second nodes.

14 Claims, 5 Drawing Sheets

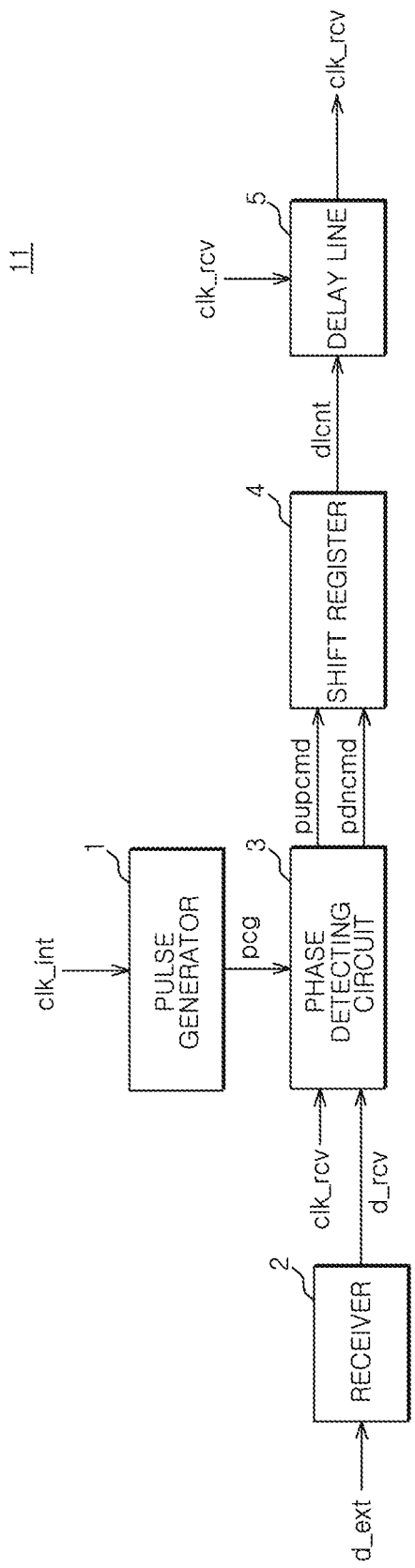

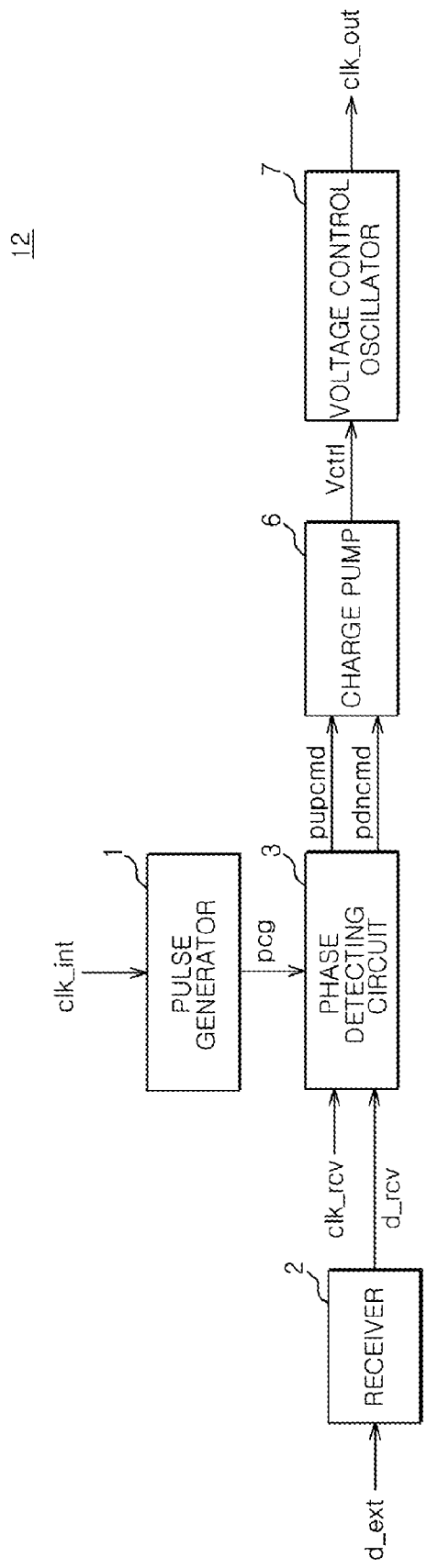

PHASE DETECTING CIRCUIT AND CLOCK GENERATING APPARATUS INCLUDING THE SAME

CROSS-REFERENCE TO RELATED PATENT APPLICATION

This application claims the benefit under 35 U.S.C 119(a) of Korean Application No. 10-2007-0102098, filed on Oct. 10, 2007, in the Korean Intellectual Property Office, the disclosure of which is incorporated herein in its entirety by reference as if set forth in full.

BACKGROUND

1. Technical Field

The embodiments described herein relate to a semiconductor integrated circuit, and more particularly to a phase detecting circuit that compares and detects phases of data and a clock and a clock generating apparatus including the same.

2. Related Art

A conventional semiconductor integrated circuit controls operations of individual regions of a circuit using a clock to increase the operational speed. In this regard, the semiconductor integrated circuit includes a clock generating apparatus such as a DLL (delay locked loop) circuit to compensate for timing delays associated with the external clock, thereby generating an internal clock. Thus, input or output data can be synchronized with the internal clock. Further, conventional semiconductor integrated circuits that operate at high speed may include a PLL (phase locked loop) circuit instead of the DLL circuit as the clock generating apparatus.

Both a DLL circuit and a PLL circuit basically include a phase detecting circuit. The phase detecting circuit of the DLL circuit compares and detects a phase of a reference clock input through a clock input buffer and a phase of a feedback clock output from a replica delay unit that performs modeling on a delayed time for transferring the output clock of a delay line to a data output buffer. The phase difference information detected from the phase detecting circuit is used to control the delay applied to the reference clock by the delay line. The PLL circuit also detects the phase difference of an input clock and an output clock, output from a voltage control oscillator, and controls the operation of a charge pump according to the detected result.

As described above, the phase detecting circuit performs an important function for determining a phase of a clock generated by the clock generating apparatus. However, recently, the operation speed of conventional semiconductor integrated circuits is increasing, and thus the frequency of the clock becomes much higher. Therefore, in conventional semiconductor integrated circuits that use a high frequency clock, the timing margin between the clock and the data is decreased since the time that is allocated to an input/output operation of a bit of data becomes shorter, which lowers the stability of data input/output operation. However, even though the stability is lowered due to the high speed operation, a conventional clock generating apparatus is not provided with a phase detecting circuit that is capable of detecting the timing of data and clock. As a result, the clock generating apparatus can not do anything when an error occurs during data input/output at high speeds. This can prevent the high speed semiconductor integrated circuit from being realized.

SUMMARY

A phase detecting circuit that detects the phase difference of data and clock to control the delayed amount of clock and a clock generating apparatus including the same is described herein.

According to one aspect, a phase detecting circuit includes a first node that outputs a pull-up control signal, a second node that outputs a pull-down control signal, an initializing unit that initializes voltage levels of the first and second nodes in response to a pre-charge signal, a data input unit configured to receive receiver data, a phase comparison unit that compares a phase of a receiver clock and a phase of the receiver data input to the data input unit to control the voltage levels of the first and second nodes, and a charging/discharging unit that charges or discharges electric charges that are applied to the first and second nodes.

According to another aspect, a clock generating apparatus includes a receiver that receives external data and outputs receiver data, a phase detecting circuit that compares a phase of a receiver clock and a phase of the receiver data in response to a pre-charge signal to generate a pull-up command signal and a pull-down command signal, a shift register that generates a delay control signal in response to the pull-up command signal and the pull-down command signal, and a delay line that delays and outputs the receiver clock in response to the delay control signal.

According to still another aspect, a clock generating apparatus includes a receiver that receives external data and outputs receiver data, a phase detecting circuit that compares a phase of a receiver clock and a phase of the receiver data in response to a pre-charge signal to generate a pull-up command signal and a pull-down command signal, a charge pump that performs a charge pumping operation in response to the pull-up command signal and the pull-down command signal to generate a control voltage, and a voltage control oscillator that oscillates an output clock in response to the control voltage.

These and other features, aspects, and embodiments are described below in the section entitled "Detailed Description."

BRIEF DESCRIPTION OF THE DRAWINGS

Features, aspects, and embodiments are described in conjunction with the attached drawings, in which:

FIG. 5 is a block diagram illustrating a clock generating apparatus according to one embodiment of the invention; and FIG. 6 is a block diagram illustrating a clock generating apparatus according to another embodiment of the invention.

DETAILED DESCRIPTION

Figure 1:
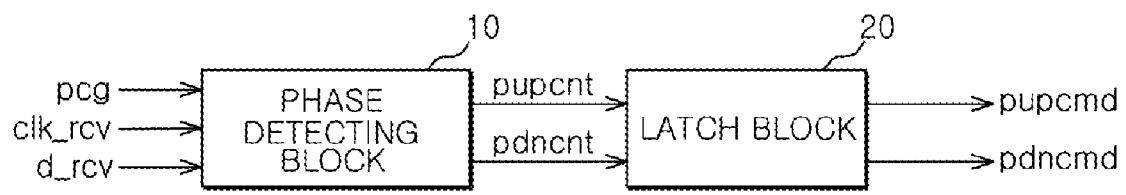
FIG. 1 is a block diagram illustrating a phase detecting circuit according to one embodiment.

FIG. 1 is a diagram illustrating a phase detecting circuit 3 configured in accordance with one embodiment. Referring to FIG. 1, the phase detecting circuit 3 can include a phase detecting block 10 and a latch block 20.

The phase detecting block 10 can be configured to detect phases of a receiver clock signal 'clk_rcv' and receiver data 'd_rcv' in response to a pre-charge signal 'pcg', to generate a pull-up control signal 'pupcnt' and a pull-down control signal 'pdncnt'. The latch block 20 can be configured to latch the pull-up control signal 'pupcnt' and the pull-down control signal 'pdncnt' to generate a pull-up command signal 'pupcmd' and a pull-down command signal 'pdncmd'.

Here, the pre-charge signal 'pcg' can be implemented using any one of a plurality of pulse signals generated from a pulse generator that is provided in a DLL circuit. The pre-charge signal can, e.g., be implemented as a low pulse signal.

When the pre-charge signal 'pcg' is enabled, the pull-up control signal 'pupcnt' and the pull-down control signal 'pdncnt' are set at a high level as the phase detecting block 10 is initialized thereafter. In this case, the receiver data 'd_rcv' can have a valid value for only a half bit period. Thereafter, the phase detecting block 10 can be configured to determine the length of time when the receiver clock signal 'clk_rcv' is at a high level overlaps a period when the receiver data 'd_rcv' has a valid value. If the high level period of the receiver clock signal 'clk_rcv' overlaps the period when the receiver data 'd_rcv' has a valid value more than a low level period thereof, then the level of the pull-down control signal 'pdncnt' gradually decreases for every toggle of the receiver clock signal 'clk_rcv'.

Thereafter, when the level of the pull-down control signal 'pdncnt' is lower than a predetermined critical value, the phase detecting block 10 can be configured to change the voltage level of the pull-down control signal 'pdncnt' to a ground level, that is, a low level, and the voltage level of the pull-up control signal 'pupcnt' to a high level.

In contrast, if the low level period of the receiver clock signal 'clk_rcv' overlaps the period when the receiver data 'd_rcv' has a valid value more than the high level period thereof, then the level of the pull-up control signal 'pupcnt' gradually decreases for every toggle of the receiver clock signal 'clk_rcv'. When the level of the pull-up control signal 'pupcnt' is lower than a predetermined critical value, the phase detecting block 10 can be configured to change the voltage level of the pull-up control signal 'pupcnt' to a low level, and the voltage level of the pull-down control signal 'pdncnt' to a high level.

When the voltage level of the pull-up control signal 'pupcnt' is low, the latch block 20 can be configured to set the pull-up command signal at a low level and set the pull-down command signal 'pdncmd' at a high level.

Meanwhile, when the voltage level of the pull-down control signal 'pdncnt' is low, the latch block 20 can be configured to set the pull-up command signal 'pupcmd' at a high level and the pull-down command signal 'pdncmd' at a low level.

When the pull-up control signal 'pupcnt' or the pull-down control signal 'pdncnt' does not become lower than a critical value, the pull-up command signal 'pupcmd' and the pull-down command signal 'pdncmd' can float. Therefore, the latch block 20 can be configured to latch the pull-up control signal 'pupcnt' and the pull-down control signal 'pdncnt' to generate the pull-up command signal 'pupcmd' and the pull-down command signal 'pdncmd' in order to prevent the pull-up command signal 'pupcmd' and the pull-down command signal 'pdncmd' from floating.

Figure 2:
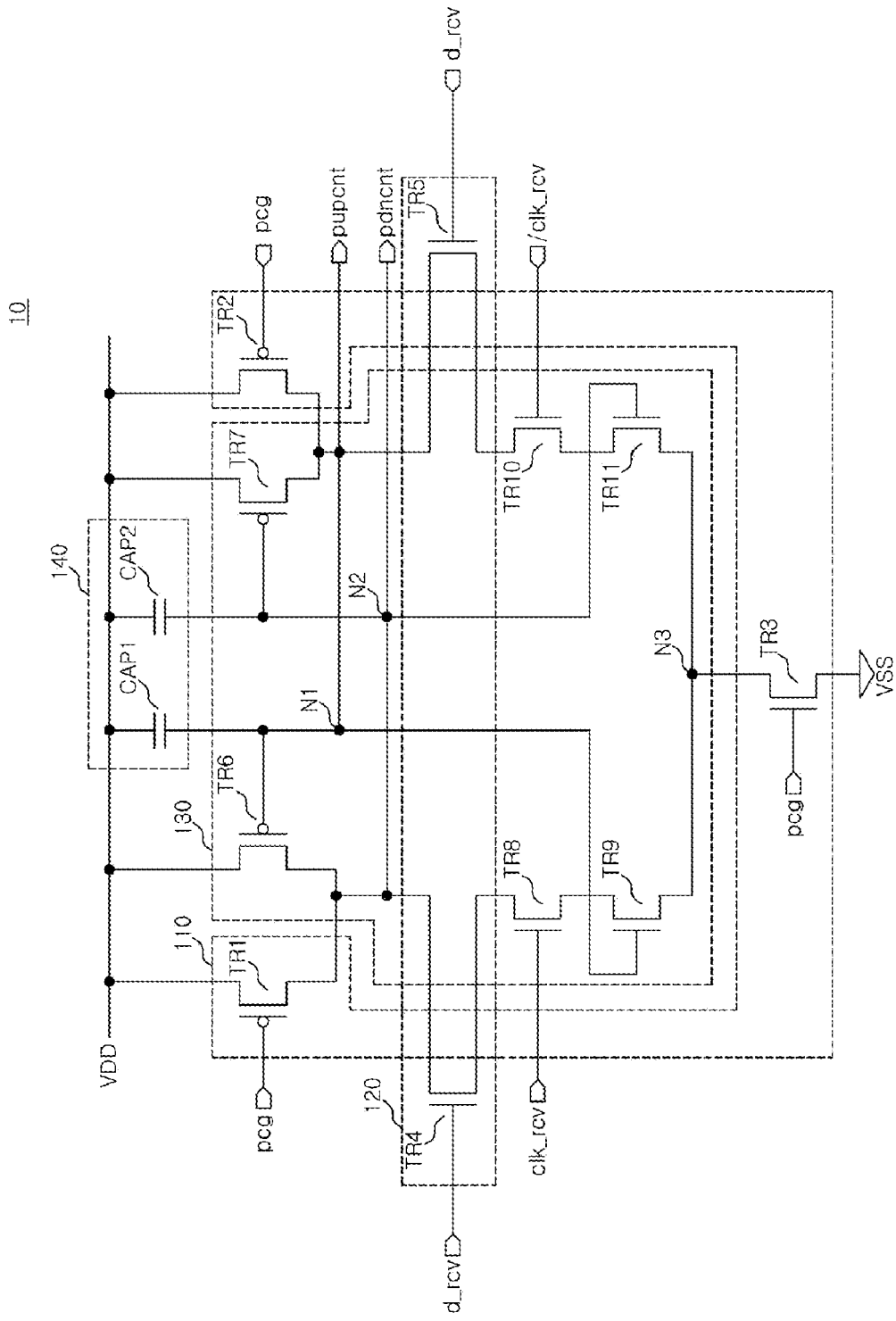
FIG. 2 is a detailed schematic diagram illustrating a phase detecting block that can be included in the circuit shown in FIG. 1.

Referring to FIG. 2, the phase detecting block 10 can include a first node N1, a second node N2, an initializing unit 110, a data input unit 120, a phase comparison unit 130, and a charging/discharging unit 140. In this embodiment, the receiver clock signal 'clk_rcv' can include a positive receiver clock signal 'clk_rcv' and a negative receiver clock signal '/clk_rcv'.

The first node N1 can be configured to output the pull-up control signal 'pupcnt', and the second node N2 can be configured to output the pull-down control signal 'pdncnt'.

The initializing unit 110 can be configured to initialize the voltage levels of the first node N1 and the second node N2 in response to the pre-charge signal 'pcg'. The initializing unit 110 can include a first transistor TR0, a second transistor TR2, and a third transistor TR3.

The first transistor TR1 can include a gate configured to receive the pre-charge signal 'pcg', a source supplied with an external power supply voltage (VDD), and a drain coupled with the second node N2. The second transistor TR2 can include a gate configured to receive the pre-charge signal 'pcg', a source supplied with the external power supply voltage (VDD), and a drain coupled with the first node N1. The third transistor TR3 can include a gate configured to receive the pre-charge signal 'pcg', a source coupled with a third node N3, and a drain supplied with a ground voltage (VSS).

The data input unit 120 can receive the receiver data 'd_rcv', and can include a fourth transistor TR4 and a fifth transistor TR5.

The fourth transistor TR4 can include a gate configured to receive the receiver data 'd_rcv', a drain coupled with the second node N2, and a source coupled with the phase comparison unit 130. The fifth transistor TR5 can include a gate configured to receive the receiver data 'd_rcv', a drain coupled with the first node N1, and a source coupled with the phase comparison unit 130.

The phase comparison unit 130 can be configured to compare phases of the receiver clock signal 'clk_rcv' and data input to the data input unit to control the voltage levels at the first node N1 and the second node N2. The phase comparison unit 130 can include a sixth transistor TR6, a seventh transistor TR7, an eighth transistor TR8, a ninth transistor TR9, a tenth transistor TR10, and an eleventh transistor TR1.

The sixth transistor TR6 can include a gate coupled with the first node N1, a source supplied with the external power supply voltage (VDD), and a drain coupled with the second node N2. The seventh transistor TR7 can include a gate coupled with the second node N2, a source supplied with the external power supply voltage (VDD), and a drain coupled with the first node N1. The eighth transistor TR8 can include a gate configured to receive the positive receiver clock signal 'clk_rcv', and a drain coupled with the source of the fourth transistor TR4 of the data input unit 120. The ninth transistor TR9 can include a gate coupled with the first node N1, a drain coupled with the source of the eighth transistor TR8, and a source coupled with the third node N3. The tenth transistor TR10 can include a gate configured to receive the negative receiver clock signal '/clk_rcv', and a drain coupled with the source of the fifth transistor TR5 of the data input unit 120. The eleventh transistor TR11 can include a gate coupled with the second node N2, a drain coupled with the source of the tenth transistor TR10, and a source coupled with the third node N3.

The charging/discharging unit 140 can be configured to charge and discharge electric charges that are applied to the first node N1 and the second node N2. The charging/discharging unit 140 can include a first capacitor CAP1 and a second capacitor CAP2.

One terminal of the first capacitor CAP1 can be coupled with a supply terminal of the external power supply voltage (VDD) and the other terminal can be coupled with the first node N1. One terminal of the second capacitor CAP2 can be coupled with a supply terminal of the external power supply voltage (VDD) and the other terminal can be coupled with the second node N2.

With this configuration, when the pre-charge signal 'pcg' is enabled as a low pulse signal in the phase detecting block 10, the external power supply voltage (VDD) can be supplied to the first and second nodes N1 and N2. Therefore, the pull-up control signal 'pupcnt' and the pull-down control signal 'pdncnt' can be pre-charged to a high level. Thereafter, when the pre-charge signal 'pcg' is disabled, the voltage levels of the first and second nodes N1 and N2 are determined by the positive receiver clock signal 'clk_rcv', the negative receiver clock signal '/clk_rcv', and the receiver data 'd_rcv'. When the receiver data 'd_rcv' maintains a logic value of "1", if a phase difference of the positive receiver clock signal 'clk_rcv' and the receiver data 'd_rcv' is larger than that of the negative receiver clock signal '/clk_rcv' and the receiver data 'd_rcv', then the voltage level of the first node N1 is lowered.

In contrast, if a phase difference of the negative receiver clock signal '/clk_rcv' and the receiver data 'd_rcv' is larger than that of the positive receiver clock signal 'clk_rcv' and the receiver data 'd_rcv', then the voltage level of the second node N2 is lowered.

The first and second capacitors CAP1 and CAP2 of the charging/discharging unit 130 can be provided to prevent the voltage levels of the first and second nodes N1 and N2 from rapidly sinking to a low level. When the voltage level of the first node N1 is low enough to turn on the fourth transistor TR4, the pull-up control signal 'pupcnt' and pull-down control signal 'pdncnt' can be at a high level and a low level, respectively. Meanwhile, when the voltage level of the second node N2 is low enough to turn on the fifth transistor TR5, the pull-up control signal 'pupcnt' and pull-down control signal 'pdncnt' can be at a low level and a high level, respectively.

Here, even though it is assumed that the logic value of the receiver data 'd_rcv' is "1", the receiver data 'd_rcv' can have a logic value of "0", and generally the receiver data 'd_rcv' can have both the logic values of "1" and "0" for a predetermined period. In this case, the period when the pre-charge signal is disabled is set to be long so that the logic value of "1" included in the receiver data 'd_rcv' is sufficient to turn on the fourth transistor TR4 or the fifth transistor TR5. This allows the phase detecting block 10 to operate satisfactorily.

Figure 3:
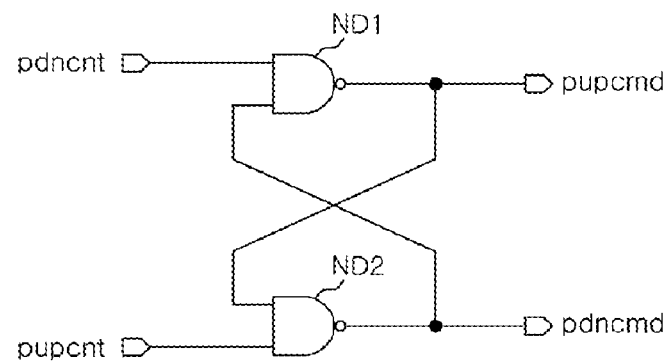
FIG. 3 is a detailed schematic diagram illustrating a latch block that can be included in the circuit shown in FIG. 1.

Referring to FIG. 3, the latch block 20 can include a first NAND gate ND1 and a second NAND gate ND2.

The NAND gate ND1 can receive the pull-down control signal 'pdncnt' and a feedback signal of the pull-down command signal 'pupcnt', and can output the pull-up command signal 'pupcmd'. The NAND gate ND2 can receive the pull-up control signal 'pupcnt' and a feedback signal of the pull-up command signal 'pupcmd', and can output the pull-down command signal 'pdncmd'.

As described above, since the pull-up control signal 'pupcnt' and pull-down control signal 'pdncnt' can float, the latch block 20 can be configured to latch the pull-up control signal 'pupcnt' and pull-down control signal 'pdncnt' to generate the pull-up command signal 'pupcmd' and the pull-down command signal 'pdncmd' of a high level or a low level, respectively.

Figure 4:
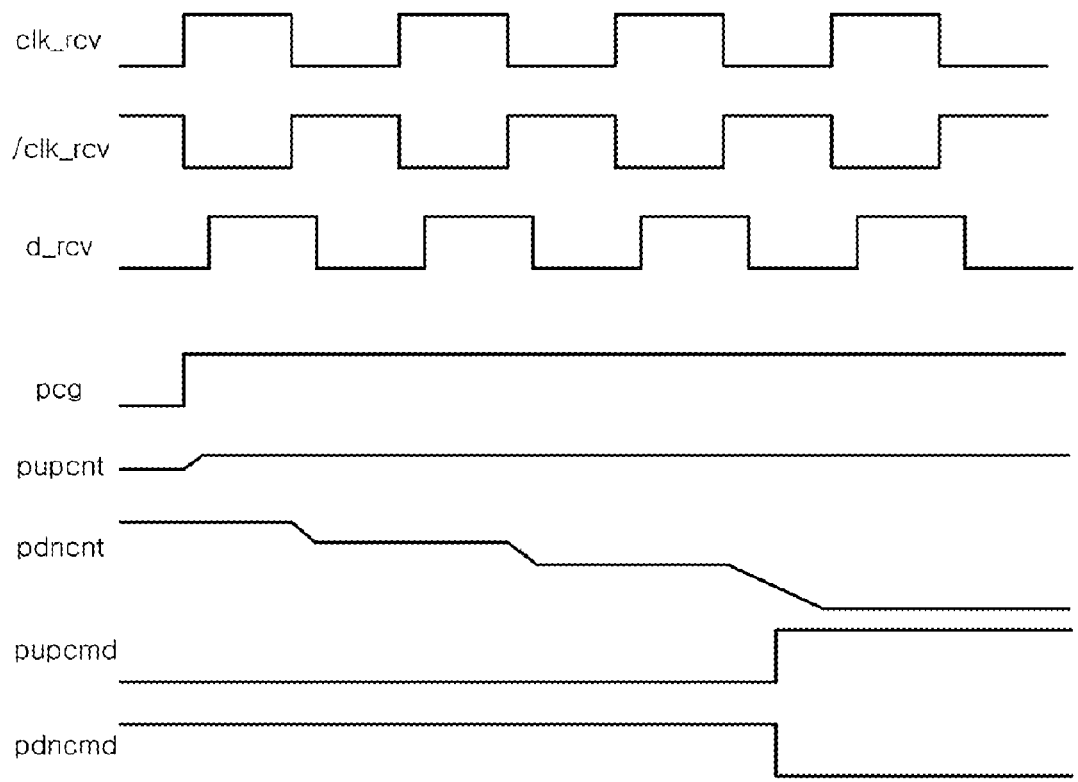
FIG. 4 is a timing diagram illustrating the operation of the phase detecting circuit of FIG. 1.

The positive receiver clock signal 'clk_rcv', the negative receiver clock signal '/clk_rcv', the receiver data 'd_rcv' the pre-charge signal 'pcg', the pull-up control signal 'pupcnt', the pull-down control signal 'pdncnt', the pull-up command signal 'pupcmd', and the pull-down command signal 'pdncmd' are shown in FIG. 4.

In the embodiment illustrated in FIG. 4, the receiver data 'd_rcv' has a valid value only for half a bit period. In the example of FIG. 4, the logic values of all the receiver data 'd_rcv' are "1", and a period when the receiver data 'd_rcv' has a valid value overlaps the period when the positive receiver clock signal 'clk_rcv' is at a high level more than the period when the positive receiver clock signal 'clk_rcv' is at a low level. When the pre-charge signal 'pcg' is enabled at a low level and then disabled, the level of the pull-down control signal 'pdncnt' is gradually lowered. At this time, the pull-up control signal 'pupcnt' is not lowered. Thereafter, at a predetermined time, the pull-down control signal 'pdncnt' has a voltage level that is defined as a low level, and pull-up control signal 'pupcnt' has a voltage level that is defined as a high level. At this time, the voltage levels of the pull-up command signal 'pupcmd' and the pull-down command signal 'pdncmd' can be changed as shown in FIG. 4.

FIG. 5 is a block diagram illustrating a configuration of a clock generating apparatus 11 according to one embodiment in which the clock generating apparatus 11 is configured as a DLL circuit, and includes the phase detecting circuit 3. Thus, the clock generating apparatus 11 can include a pulse generator 1, a receiver 2, a phase detecting circuit 3, a shift register 4, and a delay line 5.

The pulse generator 1 can receive an internal clock signal ' ' to generate a pre-charge signal 'pcg'. The receiver 2 can receive external data 'd_ext' and generate receiver data 'd_rcv'. The phase detecting circuit 3 can be configured to compare phases of a receiver clock signal 'clk_rcv' and the receiver data 'd_rcv' in response to the pre-charge signal 'pcg' to generate a pull-up command signal 'pupcmd' and a pull-down command signal 'pdncmd'. The shift register 4 can be configured to generate a delay control signal 'dlcnt' in response to the pull-up command signal 'pupcmd' and the pull-down command signal 'pdncmd'. The delay line 5 can delay the receiver clock signal 'clk_rcv' in response to the delay control signal 'dlcnt' to output a delayed receiver clock signal 'clk_rcvd'. The delayed receiver clock signal 'clk_rcvd' can be used to latch the receiver data 'd_rcv' thereafter.

The clock generating apparatus 11 can have a similar configuration to a DLL circuit. A phase detecting circuit of a general DLL circuit performs an operation of comparing the phases of a clock that is transmitted from a clock input buffer and a clock that is fed-back from a replica delay unit, whereas the phase detecting circuit 3 compares phases of data that is transmitted from the receiver and a clock of the receiver to delay the clock of the receiver. Therefore, a clock generating apparatus according to the embodiments described herein can ensure stability of data output operations, due to a reduction of a timing margin between the data and the clock at high speed operation.

FIG. 6 is a block diagram illustrating a clock generating apparatus 12 according to still another embodiment in which the clock generating apparatus 12 is configured as a PLL circuit, and includes the phase detecting circuit 3. Thus, the clock generating apparatus 12 can include a pulse generator 1, a receiver 2, a phase detecting circuit 3, a charge pump 6, and a voltage control oscillator 7.

The pulse generator 1 can receive an internal clock signal 'clk_int' to generate a pre-charge signal 'pcg'. The receiver 2 can receive external data 'd_ext' to output the receiver data 'd_rcv'. The phase detecting circuit 3 can be configured to compare a receiver clock signal 'clk_rcv' and a phase of the receiver data 'd_rcv' in response to the pre-charge signal 'pcg' to generate a pull-up command signal 'pupcmd' and a pull-down command signal 'pdncmd'. The charge pump 6 can be configured to perform a charge pumping operation in response to the pull-up command signal 'pupcmd' and the pull-down command signal 'pdncmd' to generate a control voltage 'Vctrl'. The voltage control oscillator 7 can be configured to oscillate an output clock signal 'clk_out' in response to the control voltage 'Vctrl'. The output clock signal 'clk_out' is used to latch the receiver data 'd_rcv' thereafter.

The clock generating apparatus 12 has a similar configuration to a PLL circuit. A phase detecting circuit of a general PLL circuit performs an operation of comparing the phases of a clock that is transmitted from a clock input buffer and a clock that is fed-back from a voltage control oscillator, whereas the phase detecting circuit 3 according to the embodiments described herein compares the phases of data that is transmitted from the receiver and a clock of the receiver to delay the clock of the receiver. Therefore, the clock generating apparatus 12 can support stable data output operation during a high speed operation.

As described above, in a phase detecting circuit according to the embodiments described herein and a clock generating apparatus including the same a phase difference between the data and the clock of the receiver is discriminated to control the phase of the clock of the receiver in accordance with the result so that the data is more exactly synchronized with the clock. Accordingly, it is possible to overcome reduction of the timing margin between the data and the clock in the high speed semiconductor integrated circuit and support more stable data processing. Further, the phase detecting circuit according to the embodiments described herein and the clock generating apparatus including the same can be used in various fields to synchronize the data and clock at a real time in the semiconductor integrated circuit.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings. can

What is claimed is:

1. A phase detecting circuit comprising:
   a first node that outputs a pull-up control signal;
   a second node that outputs a pull-down control signal;
   an initializing unit that initializes voltage levels of the first and second nodes in response to a pre-charge signal;
   a data input unit to which receives a receiver data;
   a phase comparison unit that compares a phase of a receiver clock and a phase of the receiver data input to the data input unit to control the voltage levels of the first and second nodes; and
   a charging/discharging unit that charges or discharges electric charges that are applied to the first and second nodes.

2. The phase detecting circuit of claim 1,
   wherein, when the pre-charge signal is enabled, the initializing unit sets the voltage levels of the first and second nodes as a first level.

3. The phase detecting circuit of claim 2,
   wherein the phase comparison unit decreases the level of the pull-up control signal for every toggle timing of the receiver clock when both the receiver data and the receiver clock are at the first level, and decreases the level of the pull-down control signal for every toggle timing of the receiver clock when the receiver data is at the first level and the receiver clock is at a second level.

4. The phase detecting circuit of claim 3,
   wherein the receiver clock includes a positive receiver clock and a negative receiver clock, and
   the phase comparison unit decreases the voltage level of the first node when the phase difference between the positive receiver clock and the receiver data input to the data input unit is larger than the phase difference between the negative receiver clock and the receiver data, and decreases the voltage level of the second node when the phase difference between the negative receiver clock and the receiver data input to the data input unit is larger than the phase difference between the positive receiver clock and the receiver data.

5. The phase detecting circuit of claim 1,
   wherein the charging/discharging unit stores the electric charges that are applied to the first and second nodes to control a voltage level change speed of the first node or the second node.

6. The phase detecting circuit of claim 1, further comprising:
   a latch unit that latches the pull-up control signal and the pull-down control signal to generate a pull-up command signal and a pull-down command signal.

7. The phase detecting circuit of claim 6,
   wherein the pull-up command signal and the pull-down command signal are transmitted to a circuit configuration for controlling a delay line of a DLL (Delay Locked Loop) circuit or a circuit configuration for controlling a charge pump of a PLL (Phase Locked Loop) circuit.

8. The phase detecting circuit of claim 1, further comprising:
   a pulse generator that receives an internal clock to generate the pre-charge signal.

9. A clock generating apparatus comprising:
   a receiver that receives an external data to output a receiver data;
   a phase detecting circuit that compares a phase of a receiver clock and a phase of the receiver data in response to a pre-charge signal to generate a pull-up command signal and a pull-down command signal;
   a shift register that generates a delay control signal in response to the pull-up command signal and the pull-down command signal; and
   a delay line that delays and outputs the receiver clock in response to the delay control signal,
   wherein the phase detecting circuit includes:
      a phase detecting unit that detects the phase of the receiver clock and the phase of the receiver data in response to the pre-charge signal to generate a pull-up control signal and a pull-down control signal; and
      a latch unit that latches the pull-up control signal and the pull-down control signal to generate the pull-up command signal and the pull-down command signal,
   wherein the phase detecting unit decreases the voltage level of the pull-up control signal for every toggle timing of the receiver clock when both the receiver data and the receiver clock are at a first level, and decreases the voltage level of the pull-down control signal for every toggle timing of the receiver clock when the receiver data is at the first level and the receiver clock is at a second level.

10. The clock generating apparatus of claim 9,
    wherein the phase detecting unit includes:
    a first node that outputs the pull-up control signal;
    a second node that outputs the pull-down control signal;
    an initializing unit that initializes voltage levels of the first and second nodes in response to the pre-charge signal;
    a data input unit to which receives the receiver data;
    a phase comparison unit that compares the phase of the receiver clock and the phase of the receiver data that is input to the data input unit to control the voltage levels of the first and second nodes; and
    a charging/discharging unit that charges or discharges electric charges that are applied to the first and second nodes.

11. The clock generating apparatus of claim 9, further comprising:

a pulse generator that receives an internal clock to generate the pre-charge signal.

12. A clock generating apparatus comprising:
a receiver that receives an external data to output a receiver data;
a phase detecting circuit that compares a phase of a receiver clock and a phase of the receiver data in response to a pre-charge signal to generate a pull-up command signal and a pull-down command signal;
a charge pump that performs a charge pumping operation in response to the pull-up command signal and the pull-down command signal to generate a control voltage; and
a voltage control oscillator that oscillates and outputs an output clock in response to the control voltage,
wherein the phase detecting circuit includes:
a phase detecting unit that detects the phase of the receiver clock and the phase of the receiver data in response to the pre-charge signal to generate a pull-up control signal and a pull-down control signal; and
a latch unit that latches the pull-up control signal and the pull-down control signal to generate the pull-up command signal and the pull-down command signal,
wherein the phase detecting unit decreases the voltage level of the pull-up control signal for every toggle timing of the receiver clock when both the receiver data and the receiver clock are at a first level, and decreases the voltage level of the pull-down control signal for every toggle timing of the receiver clock when the receiver data is at the first level, and the receiver clock is at a second level.

13. The clock generating apparatus of claim 12,
wherein the phase detecting unit includes:
a first node that outputs the pull-up control signal;
a second node that outputs the pull-down control signal;
an initializing unit that initializes voltage levels of the first and second nodes in response to the pre-charge signal;
a data input unit to which receives the receiver data;
a phase comparison unit that compares the phase of the receiver clock and the phase of the receiver data that is input to the data input unit to control the voltage levels of the first and second nodes; and
a charging/discharging unit that charges or discharges electric charges that are applied to the first and second nodes.

14. The clock generating apparatus of claim 12, further comprising:
a pulse generator that receives an internal clock to generate the pre-charge signal.

* * * * *